(12) United States Patent
Shinohara

(10) Patent No.: US 8,115,094 B2
(45) Date of Patent: Feb. 14, 2012

(54) PHOTOVOLTAIC APPARATUS

(75) Inventor: Wataru Shinohara, Kobe (JP)

(73) Assignee: SANYO Electric Co., Ltd., Moriguchi (JP)

( * ) Notice: Subject to any disclaimer, the term of this patent is extended or adjusted under 35 U.S.C. 154(b) by 129 days.

(21) Appl. No.: 11/708,050

(22) Filed: Feb. 20, 2007

(65) Prior Publication Data

US 2007/0200192 A1 Aug. 30, 2007

(30) Foreign Application Priority Data

Feb. 27, 2006 (JP) .................................. 2006-050523

(51) Int. Cl.
*H01L 25/00* (2006.01)

(52) U.S. Cl. .......................... 136/243; 136/244; 257/448

(58) Field of Classification Search .......... 136/243–244, 136/256, 258, 261; 257/431, 466, 448; 438/69, 438/72–73

See application file for complete search history.

(56) References Cited

U.S. PATENT DOCUMENTS

| | | | |
|---|---|---|---|
| 5,798,284 A * | 8/1998 | Nakagawa | 438/80 |
| 6,632,993 B2 | 10/2003 | Hayashi et al. | |
| 7,750,233 B2 * | 7/2010 | Fujioka et al. | 136/243 |
| 2002/0066478 A1 * | 6/2002 | Hayashi et al. | 136/244 |
| 2003/0172967 A1 * | 9/2003 | Tachibana et al. | 136/244 |
| 2005/0284517 A1 | 12/2005 | Shinohara | |

FOREIGN PATENT DOCUMENTS

| | | |
|---|---|---|
| CN | 1722474 | 1/2006 |
| JP | 62219674 A | 9/1987 |
| JP | 2001274430 A | 10/2001 |
| JP | 2002-118273 A | 4/2002 |
| JP | 2002-261308 A | 9/2002 |
| JP | 2002261313 A | 9/2002 |
| JP | 2005-093939 A | 4/2005 |

OTHER PUBLICATIONS

Extended European Search Report from corresponding application No. 07250674.4-1528; dated Apr. 27, 2010; English translation included.
Office Action issued on Sep. 21, 2010 in the corresponding to Japanese Patent Application No. 2006-050523.
Partial European Search Report, dated Feb. 11, 2010.
Chinese Office Action, mail date May 15, 2009.

* cited by examiner

*Primary Examiner* — David Vu
*Assistant Examiner* — Brandon Fox
(74) *Attorney, Agent, or Firm* — NDQ&M Watchstone LLP

(57) ABSTRACT

A photovoltaic apparatus includes a first photoelectric conversion portion so formed on an insulating surface of a substrate as to cover a first substrate electrode and a second substrate electrode isolated from each other by a first groove, a second photoelectric conversion portion formed on the surface of the first photoelectric conversion portion through a conductive intermediate layer, a first back electrode and a second back electrode formed on the surface of said second photoelectric conversion portion and a connecting passage portion for electrically connecting the first substrate electrode and the second back electrode, provided at a prescribed interval from the side surface of said intermediate layer.

10 Claims, 7 Drawing Sheets

PHOTOVOLTAIC APPARATUS

BACKGROUND OF THE INVENTION

1. Field of the Invention

The present invention relates to a photovoltaic apparatus, and more particularly, it relates to a photovoltaic apparatus comprising a conductive intermediate layer between a plurality of photoelectric conversion portions.

2. Description of the Background Art

A photovoltaic apparatus comprising a conductive intermediate layer between a plurality of photoelectric conversion units (photoelectric conversion portions) is known in general, as disclosed in Japanese Patent Laying-Open No. 2002-118273, for example.

In the photovoltaic apparatus disclosed in the aforementioned Japanese Patent Laying-Open No. 2002-118273, first and second transparent electrodes are formed on a substrate at a prescribed interval, while a first photoelectric conversion unit is formed on the first and second transparent electrodes. A second photoelectric conversion unit is formed on the first photoelectric conversion unit through a conductive intermediate layer. First and second back electrodes are arranged on the second photoelectric conversion unit to correspond to the aforementioned first and second transparent electrodes respectively. The first back electrode is electrically connected to the second transparent electrode through a groove so formed as to pass through the second photoelectric conversion unit, the intermediate layer and the first photoelectric conversion unit.

In the photovoltaic apparatus disclosed in the aforementioned. Japanese Patent Laying-Open No. 2002-118273, however, the first back electrode is in contact with the conductive intermediate layer in the groove, to disadvantageously result in an electrical short circuit between the first back electrode and the intermediate layer.

SUMMARY OF THE INVENTION

The present invention has been proposed in order to solve the aforementioned problem, and an object thereof is to provide a photovoltaic apparatus, comprising a conductive intermediate layer between a plurality of photoelectric conversion portions, capable of suppressing an electrical short circuit between a back electrode and the intermediate layer.

In order to attain the aforementioned object, a photovoltaic apparatus according to an aspect of the present invention comprises a substrate having an insulating surface, a first substrate electrode and a second substrate electrode formed on the insulating surface of the substrate and isolated from each other by a first groove, a first photoelectric conversion portion so formed as to cover the first substrate electrode and the second substrate electrode, a second photoelectric conversion portion formed on the surface of the first photoelectric conversion portion through a conductive intermediate layer, a first back electrode and a second back electrode, formed on the surface of the second photoelectric conversion portion, corresponding to the first substrate electrode and the second substrate electrode respectively, and a connecting passage portion for electrically connecting the first substrate electrode and the second back electrode, provided at a prescribed interval from the side surface of the intermediate layer.

In the photovoltaic apparatus according to the aforementioned aspect, as hereinabove described, the connecting passage portion for electrically connecting the first substrate electrode and the second back electrode is provided at the prescribed interval from the side surface of the intermediate layer, whereby the connecting passage portion and the intermediate layer can be electrically isolated from each other. Therefore, the second back electrode and the intermediate layer can be electrically isolated from each other. Thus, the second back electrode can be inhibited from an electrical short circuit with the intermediate layer.

The photovoltaic apparatus according to the aforementioned aspect preferably further comprises a second groove so provided as to isolate at least the intermediate layer to expose the inner side surface of the intermediate layer and cover at least the inner side surface closer to the first groove of exposed the intermediate layer with the second photoelectric conversion portion, and a third groove so formed as the connecting passage portion at a position spaced at a prescribed interval through the second photoelectric conversion portion inside the second groove from the inner side surface closer to the first groove of the intermediate layer, as to expose the surface of the first substrate electrode. According to this structure, the third groove as the connecting passage portion can be formed at the prescribed interval from the side surface of the intermediate layer by the second photoelectric conversion portion. Thus, the third groove and the intermediate layer can be electrically insolated from each other, whereby the second back electrode and the intermediate layer can be electrically isolated from each other.

In this case, the photovoltaic apparatus preferably further comprises a fourth groove for electrically isolating the first back electrode and the second back electrode from each other, formed on a region on the side opposite to the first groove with respect to the third groove, wherein the second back electrode preferably fills up the third groove formed at a position spaced at a prescribed interval from the inner side surface of the intermediate layer exposed in the second groove and is preferably electrically connected to the first substrate electrode by coming into contact with the surface of the first substrate electrode exposed in the third groove. According to this structure, the second back electrode filling up the third groove electrically isolated from the intermediate layer can be inhibited from an electrical short circuit with the intermediate layer while the second back electrode and the first substrate electrode can be electrically connected to each other.

In the aforementioned structure comprising the fourth groove, the fourth groove is preferably formed so as not to cut the intermediate layer. According to this structure, particles of the conductive intermediate layer can be prevented from flying in all directions when the fourth groove is formed dissimilarly to a case where a groove cutting the intermediate layer is provided. Therefore, the conductive particles can be prevented from adhering to the inner side surface of the fourth groove. Thus, the first back electrode can be prevented from an electrical short circuit with the intermediate layer resulting from adhesion of the conductive particles to the inner side surfaces of the fourth groove.

In this case, the fourth groove is preferably formed inside a region formed with the second groove. According to this structure, the fourth groove can be reliably so formed as not to cut the intermediate layer.

In the aforementioned structure in which the fourth groove is formed inside the region formed with the second groove, the fourth groove may be so formed as to isolate the first back electrode and the second back electrode from each other, and preferably pass through the second photoelectric conversion portion to expose the surface of the first substrate electrode.

In the aforementioned structure comprising the fourth groove, the fourth groove is preferably formed at a position spaced at a prescribed interval through the second photoelectric conversion portion inside the second groove from the inner side surface on the side opposite to the first groove of the intermediate layer exposed in the second groove. According to this structure, the fourth groove can be easily formed without cutting the intermediate layer.

In the aforementioned structure comprising the second groove and the third groove, the inner side surface on the side opposite to the first groove of the intermediate layer exposed in the second groove is preferably also covered with the second photoelectric conversion portion. Thus, the inner side surface on the side opposite to the first groove of the intermediate layer can be spaced from the second back electrode at the prescribed interval, whereby an electrical short circuit between the inner side surface on the side opposite to the first groove of the intermediate layer and the second back electrode can be inhibited.

In this case, the second photoelectric conversion portion may be so formed as to cover the inner side surface on the side opposite to the first groove of the first photoelectric conversion portion exposed in the second groove in addition to the inner side surface on the side opposite to the first groove of the intermediate layer exposed in the second groove.

In the aforementioned structure comprising the second groove and the third groove, the second photoelectric conversion portion may be so formed as to cover the inner side surface closer to the first groove of the first photoelectric conversion portion exposed in the second groove in addition to the inner side surface closer to the first groove of the intermediate layer exposed in the second groove.

In the aforementioned structure comprising the second groove and the third groove, the second groove may be so formed as to pass through the intermediate layer and the first photoelectric conversion portion and expose the surface of the first substrate electrode.

The photovoltaic apparatus according to the aforementioned aspect preferably further comprises a fifth groove so formed as to electrically isolate the first back electrode and the second back electrode from each other and pass through the second photoelectric conversion portion, the intermediate layer and the first photoelectric conversion portion, and including the connecting passage portion, an insulating member so formed as to cover at least the intermediate layer of the inner side surface on the side of the second back electrode of the fifth groove, and a conductive member electrically connected to the first substrate electrode with a surface exposed and electrically connected to the second back electrode across the insulating member in the connecting passage portion located at a prescribed interval through the insulating member from the inner side surface on the side of the second back electrode of the fifth groove. According to this structure, the conductive member formed in the fifth groove including the connecting passage portion and the intermediate layer can be electrically isolated from each other by the insulating member, whereby the second back electrode and the intermediate layer can be electrically isolated from each other. Thus, the second back electrode can be inhibited from an electrical short circuit with the intermediate layer.

In this case, the insulating member is preferably so formed as to cover the overall inner side surface on the side of the second back electrode of the fifth groove. According to this structure, the intermediate layer and the conductive member can be reliably electrically isolated from each other by the insulating member.

In the aforementioned structure comprising the conductive member electrically connected to the second back electrode across the insulating member, the upper surface of the insulating member may be so formed as to project upward beyond the upper surface of the second back electrode.

In the aforementioned structure comprising the conductive member electrically connected to the second back electrode across the insulating member, the fifth groove preferably includes a sixth groove for electrically isolating the first back electrode and the conductive member in a region closer to the first back electrode in the fifth groove, and forming a prescribed interval between the conductive member formed in the connecting passage portion and the inner side surface on the side of the first back electrode of the intermediate layer.

According to this structure, the inner side surface on the side of the first back electrode of the intermediate layer and the conductive member can be electrically isolated from each other, whereby an electrical short circuit between the inner side surface on the side of the first back electrode of the intermediate layer and the conductive member can be inhibited.

In this case, the sixth groove may be so formed as to pass through the first back electrode, the second photoelectric conversion portion, the intermediate layer and the first photoelectric conversion portion and expose the surface of the first substrate electrode.

In the photovoltaic apparatus according to the aforementioned aspect, the intermediate layer has a function of partly reflecting and partly transmitting light incident from the side of the substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

The structure of a photovoltaic apparatus 1 according to a first embodiment of the present invention is now described with reference to FIG. 1.

Figure 1:
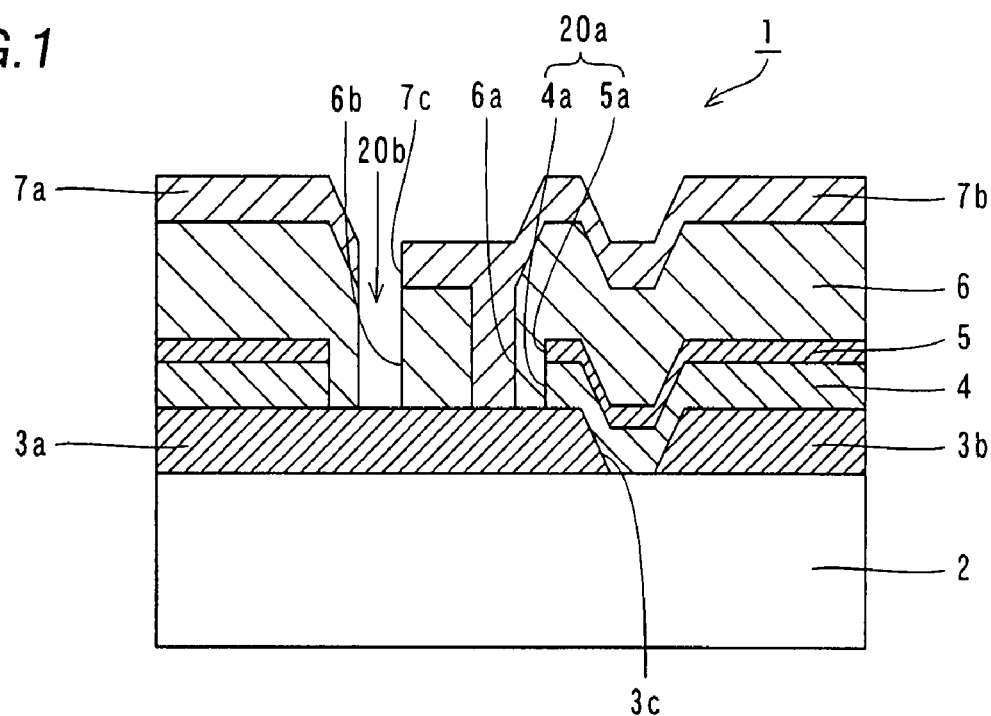
FIG. 1 is a sectional view showing the structure of a photovoltaic apparatus according to a first embodiment of the present invention.

As shown in FIG. 1, the photovoltaic apparatus 1 according to the first embodiment comprises a substrate 2, substrate electrodes 3a and 3b, a photoelectric conversion unit 4, an intermediate layer 5, another photoelectric conversion unit 6 and back electrodes 7a and 7b. This photovoltaic apparatus 1 according to the first embodiment is formed by serially connecting a plurality of units with each other in a direction along the main surface of the substrate 2. The structure of the photovoltaic apparatus 1 is now described in detail.

The substrate 2, having an insulating surface, consists of translucent glass. This substrate 2 has a thickness of about 1 mm to about 5 mm. The substrate electrodes 3a and 3b isolated from each other by a groove 3c are formed on the upper surface of the substrate 2. The substrate electrodes 3a and 3b, each having a thickness of about 800 nm, consist of TCO (transparent conductive oxide) such as tin oxide ($SnO_2$) having conductivity and translucency. The substrate electrodes 3a and 3b are examples of the "first substrate electrode" and the "second substrate electrode" in the present invention respectively, and the groove 3c is an example of the "first groove" in the present invention.

The photoelectric conversion unit 4 consisting of a p-i-n amorphous silicon semiconductor is formed on the upper surfaces of the substrate electrodes 3a and 3b. This photoelectric conversion unit 4 of the p-i-n amorphous silicon semiconductor is constituted of a p-type hydrogenated amorphous silicon carbide (a-SiC:H) layer having a thickness of about 10 nm to about 20 nm, an i-type hydrogenated amorphous silicon (a-Si:H) layer having a thickness of about 250 nm to about 350 nm and an n-type hydrogenated amorphous silicon layer having a thickness of about 20 nm to about 30 nm. The photoelectric conversion unit 4 is formed on the upper surface of the substrate electrode 3a to have a groove 4a and fill up the groove 3c. The photoelectric conversion unit 4 of the amorphous silicon semiconductor is formed for absorbing light of a relatively short wavelength. This photoelectric conversion unit 4 is an example of the "first photoelectric conversion portion" in the present invention.

The intermediate layer 5 having a groove 5a on regions corresponding to the groove 4a is formed on the upper surface of the photoelectric conversion unit 4. This intermediate layer 5 has a thickness of about 10 nm to about 500 nm. The intermediate layer 5 consists of TCO such as zinc oxide (ZnO) having conductivity with a function of partly reflecting and partly transmitting light incident from the side of the substrate 2. The intermediate layer 5 also has a function of increasing the quantity of light passing through the photoelectric conversion unit 4 by partly reflecting the light incident from the side of the substrate 2. Therefore, an output current of the photoelectric conversion unit 4 can be increased without increasing the thickness thereof. In other words, the output current of the photoelectric conversion unit 4 can be increased while suppressing photo-deterioration remarkably increased in response to the thickness of the photoelectric conversion unit 4 of the amorphous silicon semiconductor. Thus, the output currents of the photoelectric conversion units 4 and 6 can be balanced.

According to the first embodiment, the grooves 4a and 5a constitute a groove 20a for electrically isolating portions of the intermediate layer 5. The groove 20a is an example of the "second groove" in the present invention.

According to the first embodiment, the photoelectric conversion unit 6 of a p-i-n microcrystalline silicon semiconductor is formed on the upper surface of the intermediate layer 5. This photoelectric conversion unit 6 of the p-i-n microcrystalline silicon semiconductor is constituted of a p-type hydrogenated microcrystalline silicon (µc-Si:H) layer having a thickness of about 10 nm to about 20 nm, an i-type hydrogenated microcrystalline silicon layer having a thickness of about 1500 nm to about 2000 nm and an n-type hydrogenated microcrystalline silicon layer having a thickness of about 20 nm to about 30 nm. The photoelectric conversion unit 6 is formed to cover both inner side surfaces of the groove 20a and has grooves 6a and 6b in a region formed with the groove 20a. The photoelectric conversion unit 6 of the p-i-n microcrystalline silicon semiconductor is formed for absorbing light of a relatively long wavelength. The groove 6a is formed at a position spaced at a prescribed interval through the photoelectric conversion unit 6 inside the groove 20a from the inner side surface closer to the groove 3c of the groove 20a, so as to expose the substrate electrode 3a. The photoelectric conversion unit 6 is an example of the "second photoelectric conversion portion" in the present invention, and the groove 6c is an example of the "third groove" and the "connecting passage portion" in the present invention.

The back electrodes 7a and 7b isolated from each other by a groove 7c formed on a region corresponding to the groove 6b are formed on the upper surface of the photoelectric conversion unit 6. The back electrodes 7a and 7b, each having a thickness of about 200 nm to about 400 nm, consist of a metal material mainly composed of silver (Ag). These back electrodes 7a and 7b have a function of reflecting light incident from the lower surface of the substrate 2 to reach the back electrodes 7a and 7b, thereby reintroducing the same into the photoelectric conversion units 4 and 6. The back electrode 7a fills up the groove 6a and comes into contact with the surface of the substrate electrode 3a exposed in the groove 6a, whereby the back electrode 7a is electrically connected to the substrate electrode 3a. Thus, the substrate electrode 3a and the back electrode 7b of the adjacent unit are serially connected with each other. The back electrodes 7a and 7b are examples of the "first back electrode" and the "second back electrode" in the present invention respectively.

According to the first embodiment, the grooves 6b and 7d constitute a groove 20b for electrically isolating the back electrodes 7a and 7b from each other. The groove 20b is formed in a region formed with the groove 20a. The groove 20b is formed at a position spaced at a prescribed interval through the photoelectric conversion unit 6 inside from the inner side surface on the side opposite to the groove 3c of the groove 20a so as to expose the substrate electrode 3a. The groove 20b is an example of the "fourth groove" in the present invention.

A process of manufacturing the photovoltaic apparatus 1 according to the first embodiment of the present invention is now described with reference to FIGS. 1 to 9.

Figure 2:
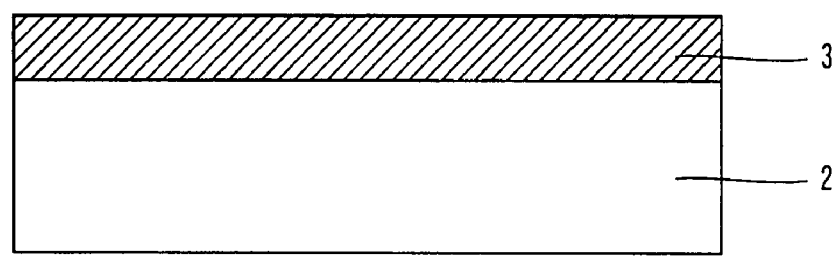
FIGS. 2 to 9 are sectional views for illustrating a process of manufacturing the photovoltaic apparatus according to the first embodiment shown in FIG. 1.

As shown in FIG. 2, a substrate electrode 3 of tin oxide having a thickness of about 800 nm is formed on the insulating upper surface of the substrate 2 by thermal CVD (chemical vapor deposition).

Figure 3:
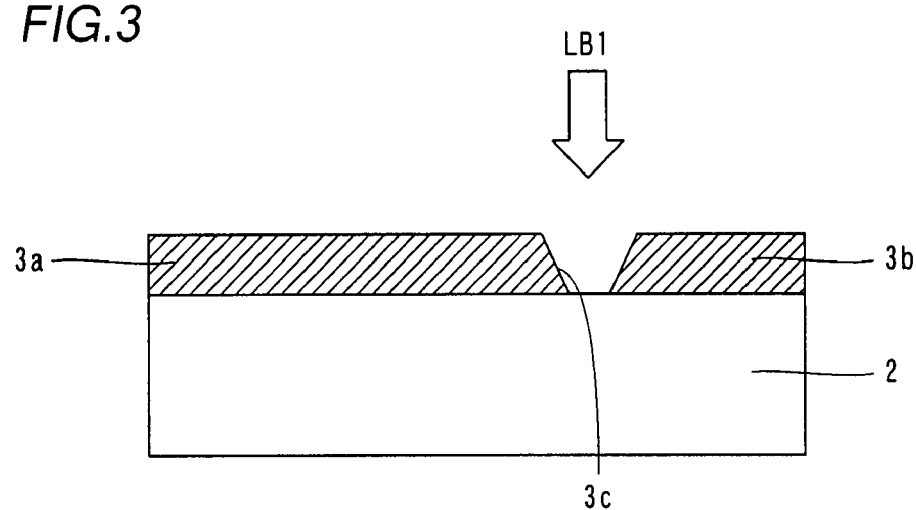

As shown in FIG. 3, the groove 3c is formed by scanning the substrate electrode 3 with a fundamental wave LB1 of an Nd:YAG laser having a wavelength of about 1064 nm, an oscillation frequency of about 20 kHz and average power of about 14.0 W from above. Thus, the substrate electrode 3 is separated into the substrate electrodes 3a and 3b through the groove 3c.

Figure 4:
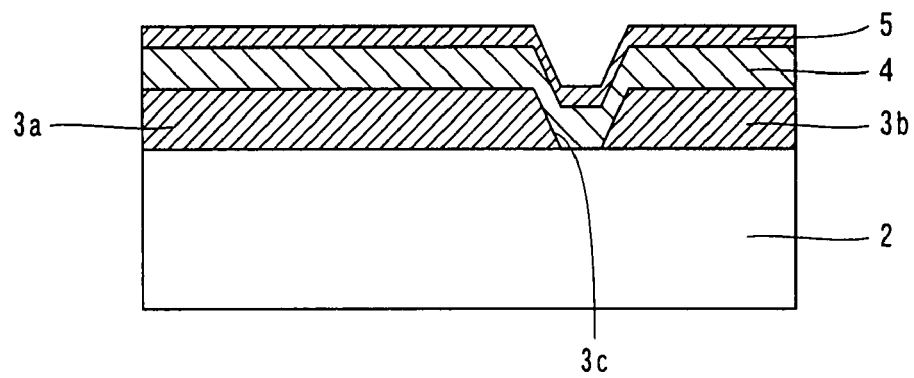

As shown in FIG. 4, the photoelectric conversion unit 4 of the amorphous silicon semiconductor is formed by successively forming the p-type hydrogenated amorphous silicon carbide layer having the thickness of about 10 nm to about 20 nm, the i-type hydrogenated amorphous silicon layer having the thickness of about 250 nm to about 350 nm and the n-type hydrogenated amorphous silicon layer having the thickness of about 20 nm to about 30 nm on the upper surfaces of the substrate electrodes 3a and 3b by plasma CVD. At this time, the photoelectric conversion unit 4 is embedded in the groove 3c. Thereafter the intermediate layer 5 of zinc oxide having the thickness of about 10 nm to about 500 nm is formed on the upper surface of the photoelectric conversion unit 4 by sputtering.

Figure 5:
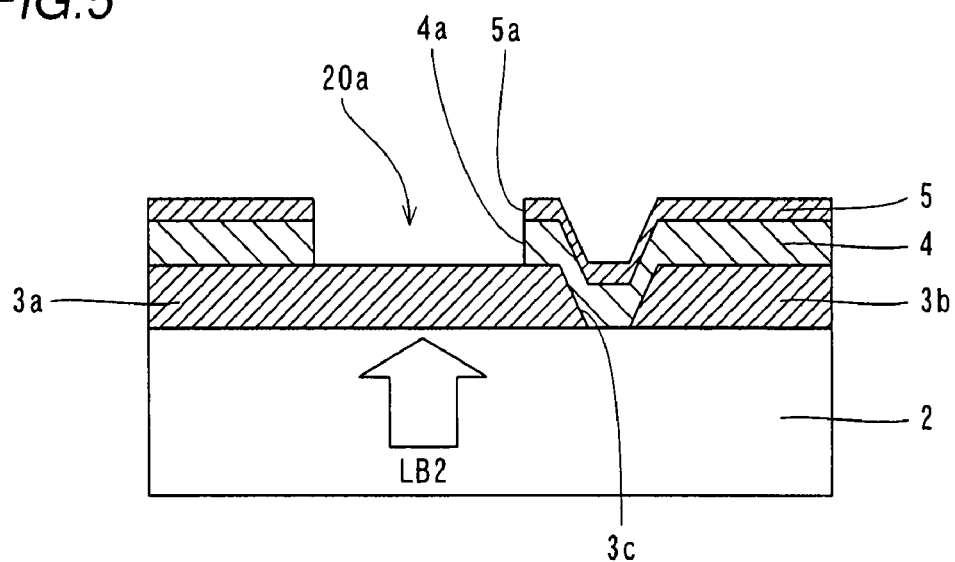

As shown in FIG. 5, the groove 20a constituted of the grooves 4b and 5b is formed to be adjacent to the groove 3c by scanning the photoelectric conversion unit 4 and the intermediate layer 5 with second harmonics LB2 of an Nd:YAG laser having a wavelength of about 532 nm, an oscillation frequency of about 12 kHz and average power of about 230 mW from the side of the substrate 2.

Figure 6:
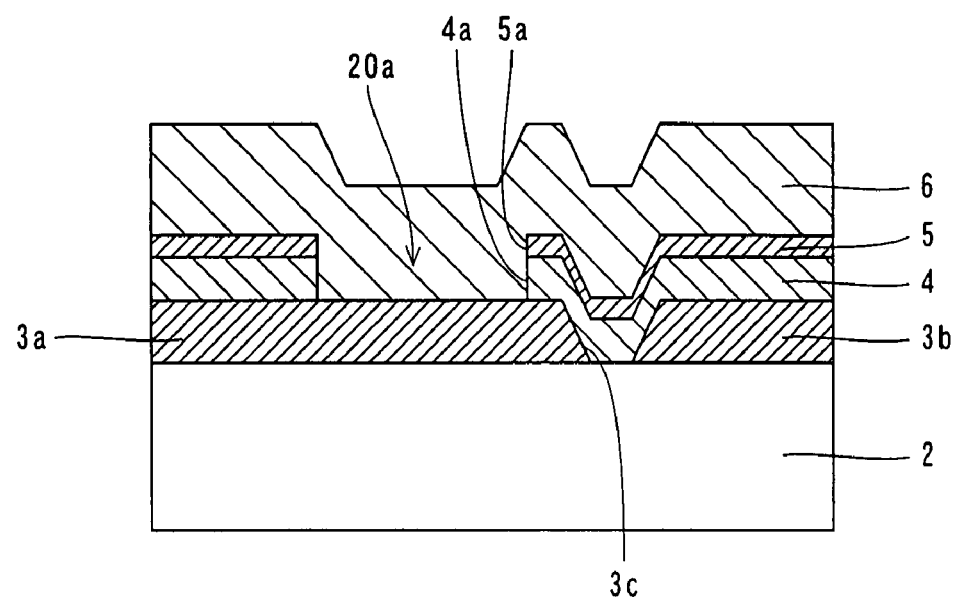

Thereafter, as shown in FIG. 6, the photoelectric conversion unit 6 of the microcrystalline silicon semiconductor is formed by successively forming the p-type hydrogenated microcrystalline silicon layer having the thickness of about 10 nm to about 20 nm, the i-type hydrogenated microcrystalline silicon layer having the thickness of about 1500 nm to about 2000 nm and the n-type hydrogenated microcrystalline silicon layer having the thickness of about 20 nm to about 30 nm on the upper surface of the intermediate layer 5 by plasma CVD. At this time, the photoelectric conversion unit 6 is embedded in the groove 20a.

Figure 7:
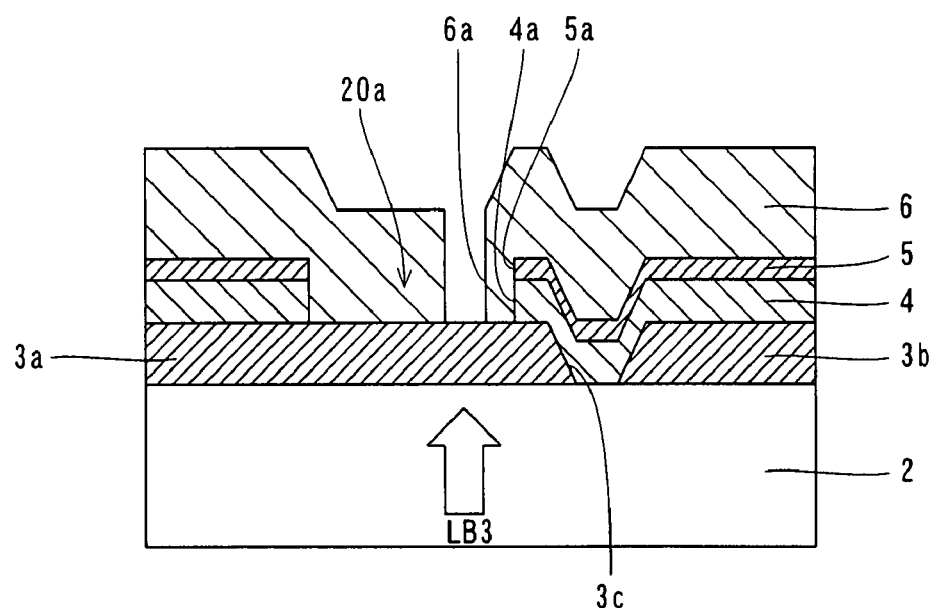

As shown in FIG. 7, the groove 6a is formed at the position spaced at the prescribed interval through the photoelectric conversion unit 6 inside from the inner side surface closer to the groove 3c of the groove 20a by scanning the photoelectric conversion unit 6 with second harmonics LB3 of an Nd:YAG laser having a wavelength of about 532 nm, an oscillation frequency of about 12 kHz and average power of about 230 mW from the side of the substrate 2.

Figure 8:
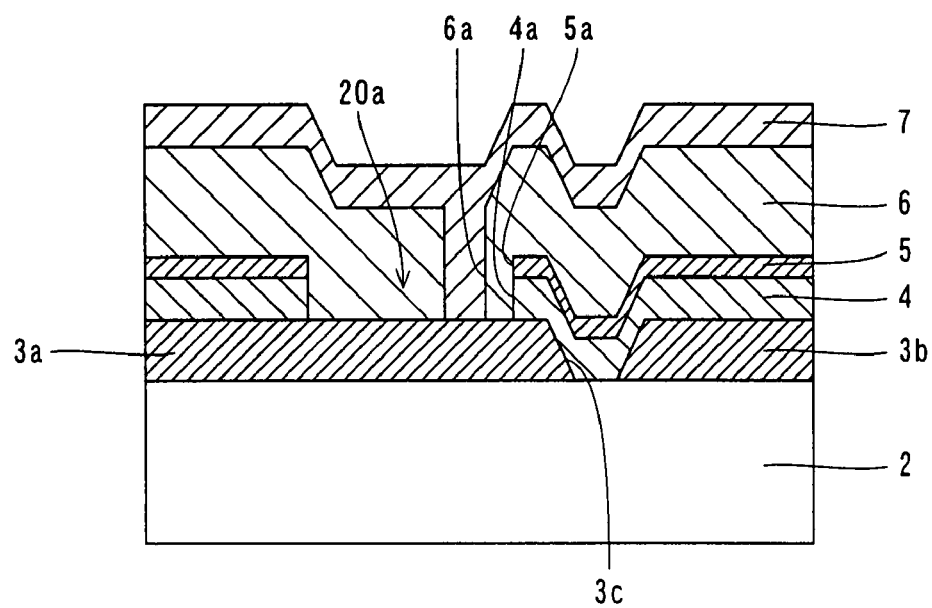

Thereafter, as shown in FIG. 8, the back electrode 7, having the thickness of about 200 nm to about 400 nm, of the metal material mainly composed of silver is formed on the upper surface of the photoelectric conversion unit 6 by sputtering. At this time, the back electrode 7 is embedded in the groove 6a.

Figure 9:
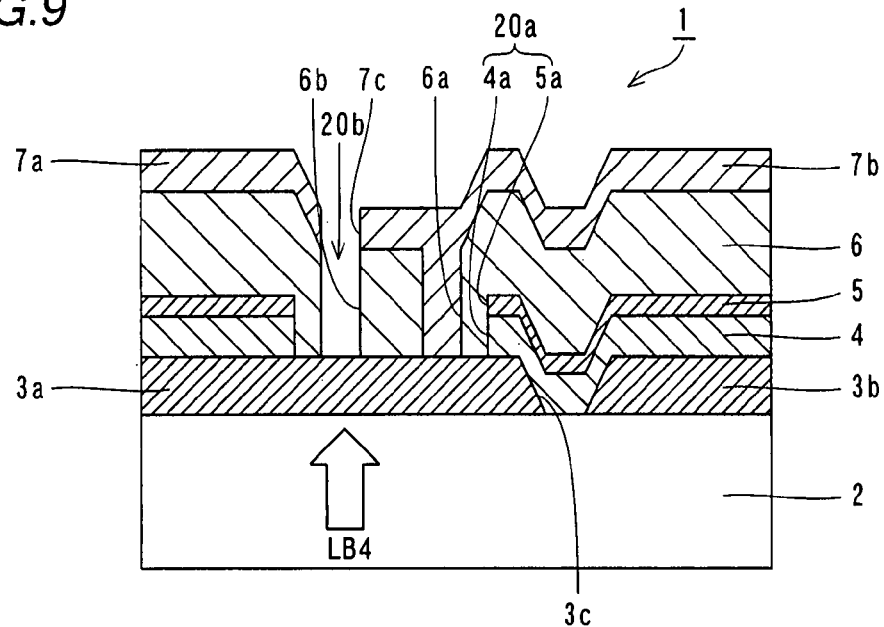

As shown in FIG. 9, the groove 20b constituted of the grooves 6b and 7c is formed at the position spaced at the prescribed interval through the photoelectric conversion unit 6 inside from the inner side surface on the side opposite to the groove 3c of the groove 20a by scanning the photoelectric conversion unit 6 and the back electrode 7 with second harmonics LB4 of an Nd:YAG laser having a wavelength of about 532 nm, an oscillation frequency of about 12 kHz and average power of about 230 mW from the side of the substrate 2. Thus, the back electrode 7 is separated into the back electrodes 7a and 7b through the groove 20a.

According to the first embodiment, as hereinabove described, the groove 6a for electrically connecting the substrate electrode 3a and the back electrode 7b is provided at the prescribed interval through the photoelectric conversion unit 6 inside the groove 20a from the inner side surface closer to the groove 3c of the intermediate layer 5, whereby the back electrode 7b filling up the groove 6a can be electrically isolated from the portion of the intermediate layer 5. Thus, the back electrode 7b can be inhibited from an electrical short circuit with the portion of the intermediate layer 5.

According to the first embodiment, the groove 20b not cutting the intermediate layer 5 is provided, whereby particles of the conductive intermediate layer 5 can be prevented from flying in all directions when the groove 20b is formed dissimilarly to a case where an groove cutting the intermediate layer is provided. Therefore, the conductive particles can be prevented from adhering to the inner side surfaces of the groove 20b. Thus, the back electrode 7a can be prevented from an electrical short circuit with the portions of the intermediate layer 5 resulting from adhesion of the conductive particles to the inner side surfaces of the groove 20b.

According to the first embodiment, the groove 20b is provided at the position spaced at the prescribed interval through the photoelectric conversion unit 6 inside from the inner side surface opposite to the side of the groove 3c of the groove 20a, whereby the groove 20b can be easily formed without cutting the intermediate layer 5.

Figure 10:
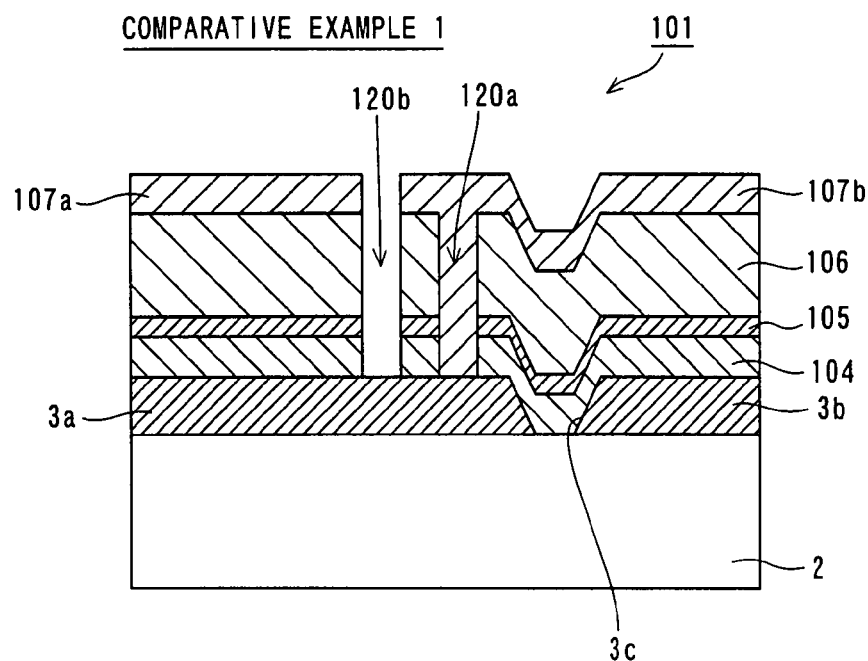
FIG. 10 is a sectional view showing the structure of a photovoltaic apparatus according to comparative example 1 with respect to the first embodiment of the present invention.

An experiment conducted for confirming the aforementioned effects of the first embodiment is now described. In this confirmatory experiment, photovoltaic apparatuses 1 and 101 according to Example 1 and comparative example 1 were prepared as follows:

First, the photovoltaic apparatus 1 according to Example 1 was prepared as shown in FIG. 1, through the manufacturing process employed in the first embodiment. The photovoltaic apparatus 101 according to comparative example 1 was prepared to have a structure shown in FIG. 10. At this time, a photoelectric conversion unit 104, an intermediate layer 105, another photoelectric conversion unit 106 and back electrodes 107a and 107b of the photovoltaic apparatus 101 according to comparative example 1 were so formed as to have the same thicknesses and compositions as those of a photoelectric conversion unit 4, an intermediate layer 5, another photoelectric conversion unit 6 and back electrodes 7a and 7b of the photovoltaic apparatus 1 according to Example 1 respectively. Further, the photovoltaic apparatus 101 according to comparative example 1 was formed with grooves 120a and 120b corresponding to grooves 6a and 20b of the photovoltaic apparatus 1 according to Example 1 respectively. According to comparative example 1, the back electrode 107b was directly embedded in the groove 120a, to be electrically connected to a substrate electrode 3a. The groove 120b electrically isolates the back electrodes 107a and 107b from each other while electrically isolating portions of the intermediate layer 105 from each other.

As to the photovoltaic apparatuses 1 and 101 prepared according to the aforementioned Example 1 and comparative example 1, open circuit voltages (Voc), short circuit currents (Isc), fill factors (F.F.), maximum power levels (Pmax) and conversion efficiency levels (Eff.) were measured and the results of the measurements were standardized with those of the photovoltaic apparatus 101. Table 1 shows the results.

TABLE 1

| | Open Circuit Voltage | Short Circuit Voltage | Fill Factor | Maximum Power | Conversion Efficiency |
|---|---|---|---|---|---|
| Example 1 | 1.00 | 1.02 | 1.05 | 1.10 | 1.10 |
| Comparative Example 1 | 1.00 | 1.00 | 1.00 | 1.00 | 1.00 |

Referring to Table 1, it has been proved that the open circuit voltage of the photovoltaic apparatus 1 according to Example 1 is identical to that of the photovoltaic apparatus 101 according to comparative example 1. It has also been proved that the short circuit current and the fill factor of the photovoltaic apparatus 1 according to Example 1 are improved by 2% and 5% with respect to those of the photovoltaic apparatus 101 according to comparative example 1 respectively. It has further been proved that the maximum power and the conversion efficiency of the photovoltaic apparatus 1 according to Example 1 are improved by 10% and 10% with respect to those of the photovoltaic apparatus 101 according to comparative example 1 respectively.

The aforementioned results have conceivably been obtained for the following reasons: In the photovoltaic apparatus 1 according to Example 1 shown in FIG. 1, the photoelectric conversion unit 6 formed to cover the inner side surfaces of the groove 20a electrically isolates the back electrodes 7a and 7b from the portions of the intermediate layer 5 for inhibiting the back electrodes 7a and 7b from an electrical short circuit with the portions of the intermediate layer 5, thereby conceivably improving the conversion efficiency. In the photovoltaic apparatus 101 according to comparative example 1 shown in FIG. 10, on the other hand, the back electrode 107b embedded in the groove 120a is in contact with the intermediate layer 5 in this groove 120a to cause an electrical short circuit with the intermediate layer 105, and particles of the conductive intermediate layer 105 flying in all directions when the groove 120b is formed adhere to the inner side surfaces of the groove 120b to cause an electrical short circuit of the back electrode 107a and the intermediate layer 105, conceivably resulting in reduction of the conversion efficiency.

(Second Embodiment)

Figure 11:
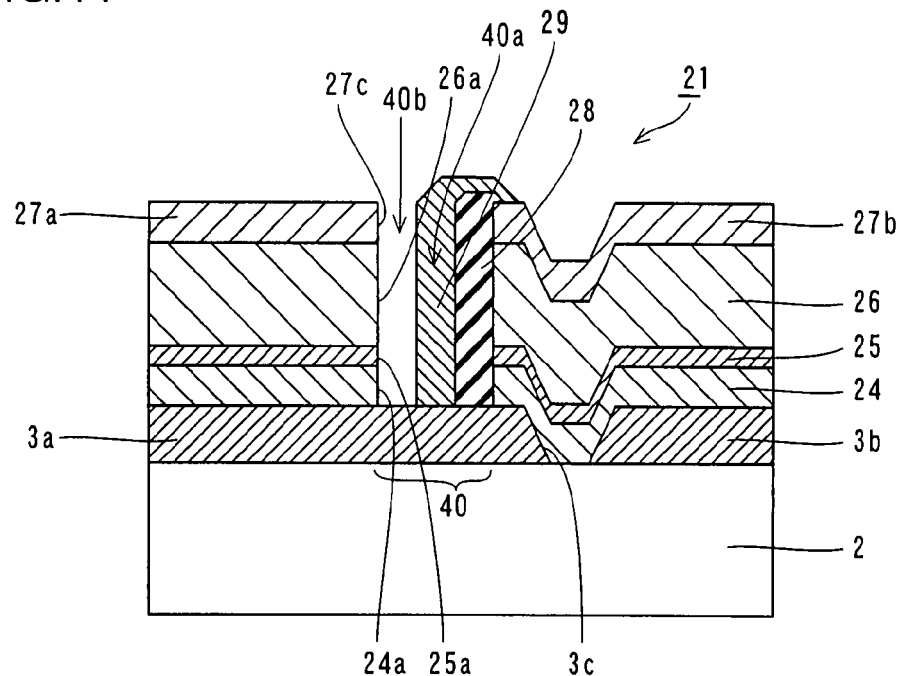
FIG. 11 is a sectional view showing the structure of a photovoltaic apparatus according to a second embodiment of the present invention.

Referring to FIG. 11, a photovoltaic apparatus 21 according to a second embodiment of the present invention comprises an insulating member 28 and a connecting electrode 29, in which the connecting electrode 29 electrically connects a substrate electrode 3a and a back electrode 7b with each other, dissimilarly to the aforementioned first embodiment.

In other words, this photovoltaic apparatus 21 according to the second embodiment has a groove 24a on the upper surface of a substrate electrode 3a, in which a photoelectric conversion unit 24 is formed to be embedded in a groove 3c as shown in FIG. 11. An intermediate layer 25 having a groove 25a on a region corresponding to the groove 24a is formed on the upper surface of the photoelectric conversion unit 24. An intermediate layer 26 having a groove 26a on a region corresponding to the groove 25a is formed on the upper surface of the intermediate layer 25. Back electrodes 27a and 27b isolated from each other by a groove 27c formed on a region corresponding to the groove 26 are formed on the upper surface of the photoelectric conversion unit 26. The photoelectric conversion unit 24, the intermediate layer 25, another photoelectric conversion unit 26, and the back electrodes 27a and 27b of the photovoltaic apparatus 21 according to the second embodiment are so formed as to have the same thicknesses and compositions as those of the photoelectric conversion unit 4, the intermediate layer 5, another photoelectric conversion unit 6 and the back electrodes 7a and 7b of the photovoltaic apparatus 1 according to the aforementioned first embodiment respectively.

According to the second embodiment, the grooves 24b, 25b, 26b and 27d constitute a groove 40 for electrically isolating portions of the intermediate layer 25 from each other and electrically isolating the back electrodes 27a and 27b from each other. The groove 40 is an example of the "fifth groove" in the present invention.

According to the second embodiment, an insulating member 28 is formed to cover the inner side surface on the side of the back electrode 27b of the groove 40. The insulating member 28 consists of epoxy resin containing aluminum oxide ($Al_2O_3$) particles. This insulating member 28 is formed to cover the overall side surface on the side of the back electrode 27b of the groove 40. The upper surface of the insulating member 28 is so formed as to protrude upward beyond the upper surface of the back electrode 27b. A connecting electrode 29 is formed in a connecting passage portion 40a located at a prescribed interval through the insulating member 28 from the inner side surface on the side of the back electrode 27b of the groove 40. This connecting electrode 29 comes in contact with the surface of the substrate electrode 3a exposed in the connecting passage portion 40a, whereby the connecting electrode 29 is so formed to be electrically connected to the substrate electrode 3a and to be electrically connected to the back electrode 27b across the insulating member 28. Thus, the substrate electrode 3a and the back electrode 27b of the adjacent unit are serially connected with each other. The connecting electrode 29 consists of conductive paste (silver paste). The connecting electrode 29 is an example of the "conductive member" in the present invention.

The groove 40 electrically isolates the back electrode 27a and the connecting electrode from each other on a region closer to the back electrode 27a of the groove 40 and includes a groove 40b for forming a prescribed interval between the connecting electrode 29 formed in the connecting passage portion 40a and the inner side surface on the side of the back electrode 27a of the groove 40. The groove 40b is so formed as to pass through the back electrode 27a, the photoelectric conversion unit 26, the intermediate layer 25 and the photoelectric conversion unit 24 and expose the surface of the substrate electrode 3a. The groove 40b is an example of the "sixth groove" in the present invention.

A process of manufacturing the photovoltaic apparatus 21 according to the second embodiment of the present invention is now described with reference to FIGS. 11 to 14. Steps up to formation of the groove 3c in the substrate electrode 3 are similar to those for the photovoltaic apparatus 1 according to the first embodiment shown in FIGS. 2 and 3.

Figure 12:
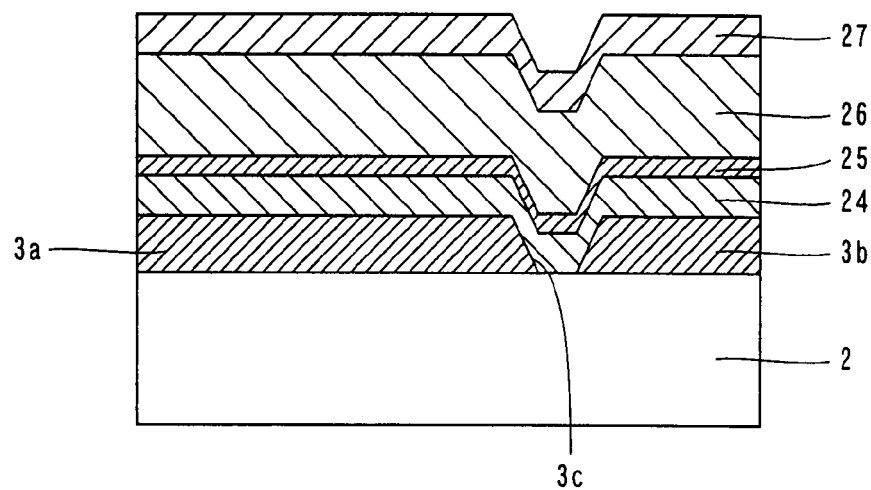
FIGS. 12 to 14 are sectional views for illustrating a process of manufacturing the photovoltaic apparatus according to the second embodiment shown in FIG. 11.

According to the second embodiment, as shown in FIG. 12, the photoelectric conversion unit 24 of the amorphous silicon semiconductor is formed on the upper surface of the substrate electrodes 3a and 3b to be embedded in the groove 3c by plasma CVD. Thereafter the intermediate layer 25 is formed on the upper surface of the photoelectric conversion unit 24 by sputtering. The photoelectric conversion unit 26 of the microcrystalline silicon semiconductor is formed on the upper surface of the intermediate layer 25 by plasma CVD. Thereafter the back electrode 27 is formed on the upper surface of the photoelectric conversion unit 26 by sputtering.

According to the second embodiment, the photoelectric conversion unit 24, the intermediate layer 25, the photoelectric conversion unit 26 and the back electrode 27 are so continuously formed that the surfaces of the photoelectric conversion unit 24, the intermediate layer 25 and the photoelectric conversion unit 26 are not exposed to the atmosphere.

Figure 13:
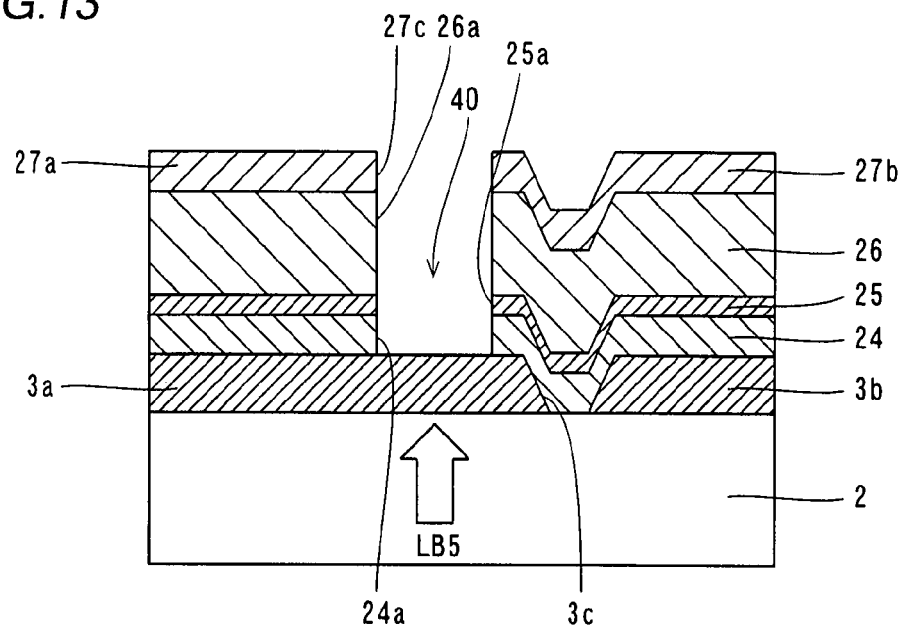

As shown in FIG. 13, the groove 40 constituted of the grooves 24a, 25a, 26a and 27a are formed to be adjacent to the groove 3c by scanning the photoelectric conversion unit 24, the intermediate layer 25, the photoelectric conversion unit 26 and the back electrode 27 with second harmonics LB5 of an Nd:YAG laser having a wavelength of about 532 nm, an oscillation frequency of about 12 kHz and average power of about 230 mW from the side of the substrate 2. Thus, the back electrode 7 is separated into the back electrodes 7a and 7b through the groove 20a.

Figure 14:
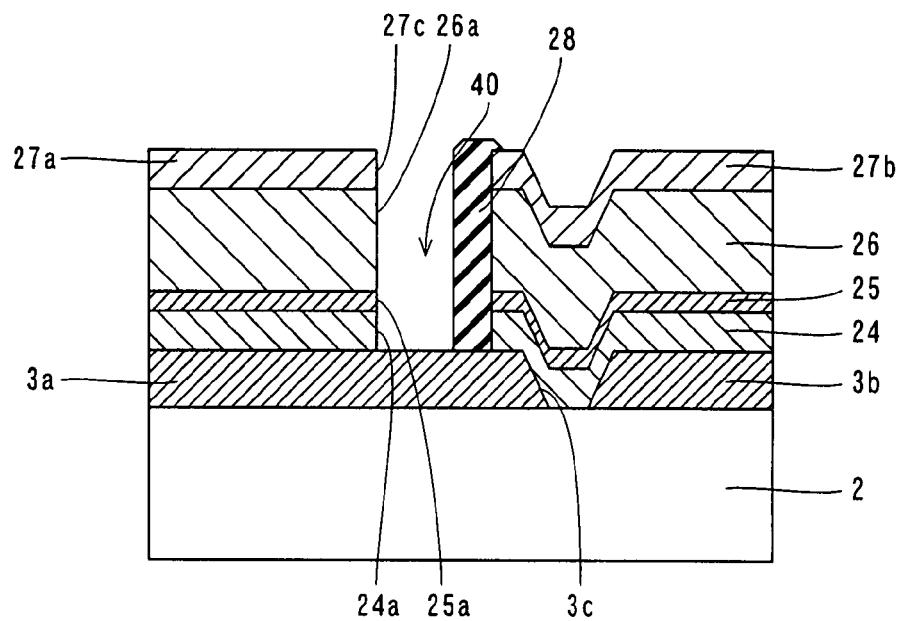

As shown in FIG. 14, the insulating member 28 is applied by screen printing, to cover the inner side surface on the side of the back electrode 27b of the groove 40 with the insulating member 28 and extend onto the back electrode 27b. Thereafter, as shown in FIG. 11, the connecting electrode 29 is applied to the connecting passage portion 40a located at the prescribed interval through the insulating member 28 from the inner side surface on the side of the back electrode 27b of the groove 40 by screen printing to cover the insulating member 28. The connecting electrode 29 comes into contact with the surface of the substrate electrode 3a exposed in the connecting passage portion 40a, whereby the connecting electrode 29 is electrically connected to the substrate electrode 3a and electrically connected to the back substrate 27b across the insulating member 28. The groove 40b is formed for electrically isolating the back electrode 27a and the connecting electrode 29 on the region closer to the back electrode 27a in the groove 40 and forming the prescribed interval between the connecting electrode 29 formed in the connecting passage portion 40a and the inner side surface on the side of the back electrode 27a of the groove 40.

According to the second embodiment, as hereinabove described, the insulating member 28 covering the inner side surface on the side of the back electrode 27b of the groove 40 is provided, and the connecting electrode 29 for electrically connecting the substrate electrode 3a and the back electrode 27b is provided at the prescribed interval through the insulating member 28 from the inner side surface on the side of the back electrode 27b of the groove 40, whereby the connecting electrode 29 formed in the connecting passage portion 40a and the intermediate layer 25 are electrically isolated from each other by the insulating member 28. Therefore, the back electrode 27b and the intermediate layer 25 can be electrically isolated from each other. Thus, the back electrode 27b can be inhibited from an electrical short circuit with the intermediate layer 25.

According to the second embodiment, the connecting electrode 29 is provided independently of the back electrode 27 so that a manufacturing process of subsequently forming the back electrode 27 after forming the photoelectric conversion portion 26 and thereafter forming the groove 40 while forming the connecting electrode 29 in the groove 40 can be employed, whereby the surface of the photoelectric conversion unit 26, to be most inhibited from contamination in the process of manufacturing the photovoltaic apparatus 21, can be prevented from exposure to the atmosphere.

Although the present invention has been described and illustrated in detail, it is clearly understood that the same is by way of illustration and example only and is not to be taken by way of limitation, the spirit and scope of the present invention being limited only by the terms of the appended claims.

For example, while the groove 4a of the photoelectric conversion unit 4 and the groove 5a of the intermediate layer 5 constitute the groove 20a electrically isolating the portions of the intermediate layer 5 in the aforementioned the first embodiment, the present invention is not restricted to this but at least a groove cutting the intermediate layer may be alternatively formed to electrically isolate the same.

While the insulating member does not fill up the groove 40b for electrically cutting the back electrode 27a and the connecting electrode 29 in the aforementioned second embodiment, the present invention is not restricted to this but the insulating member may fill up the groove 40b for electrically cutting the back electrode 27a and the connecting electrode 29.

What is claimed is:

1. A photovoltaic apparatus comprising:
   a substrate having an insulating surface;
   a first substrate electrode and a second substrate electrode formed on said insulating surface of said substrate and isolated from each other by a first groove;
   a first photoelectric conversion portion so formed as to cover said first substrate electrode and said second substrate electrode;
   a second photoelectric conversion portion formed on the surface of said first photoelectric conversion portion through a conductive intermediate layer;
   a first back electrode and a second back electrode, formed on the surface of said second photoelectric conversion portion, corresponding to said first substrate electrode and said second substrate electrode respectively;
   a connecting passage portion constituting a groove for electrically connecting said first substrate electrode and said second back electrode, provided at a prescribed interval from the side surface of said intermediate layer so as not to expose the side surface of the intermediate layer; and
   a back electrode separation groove for electrically isolating said first back electrode and said second back electrode from each other, provided at a prescribed interval from said connecting passage portion,
   wherein said back electrode separation groove exposes the surface of said first substrate electrode so as not to expose the side surface of said intermediate layer.

2. The photovoltaic apparatus according to claim 1, further comprising:
   a second groove so provided as to isolate at least said intermediate layer to expose the inner side surface of said intermediate layer and cover at least the inner side surface closer to said first groove of exposed said intermediate layer with said second photoelectric conversion portion, wherein said connecting passage portion includes
   a third groove so formed at a position spaced at a prescribed interval through said second photoelectric conversion portion inside said second groove from the inner side surface closer to said first groove of said intermediate layer, as to expose the surface of said first substrate electrode.

3. The photovoltaic apparatus according to claim 2, wherein said back electrode separation groove is formed on a region on the side opposite to said first groove with respect to said third groove, and
   said second back electrode fills up said third groove formed at a position spaced at a prescribed interval from the inner side surface of said intermediate layer exposed in said second groove and is electrically connected to said first substrate electrode by coming into contact with the surface of said first substrate electrode exposed in said third groove.

4. The photovoltaic apparatus according to claim 1, wherein said back electrode separation groove is formed inside a region formed with said second groove.

5. The photovoltaic apparatus according to claim 3, wherein said back electrode separation groove is formed at a position spaced at a prescribed interval through said second photoelectric conversion portion inside said second groove from the inner side surface on the side opposite to said first groove of said intermediate layer exposed in said second groove.

6. The photovoltaic apparatus according to claim 2, wherein the inner side surface on the side opposite to said first groove of said intermediate layer exposed in said second groove is also covered with said second photoelectric conversion portion.

7. The photovoltaic apparatus according to claim 6, wherein said second photoelectric conversion portion is so formed as to cover the inner side surface on the side opposite to said first groove of said first photoelectric conversion portion exposed in said second groove in addition to the inner side surface on the side opposite to said first groove of said intermediate layer exposed in said second groove.

8. The photovoltaic apparatus according to claim 2, wherein said second photoelectric conversion portion is so formed as to cover the inner side surface closer to said first groove of said first photoelectric conversion portion exposed in said second groove in addition to the inner side surface closer to said first groove of said intermediate layer exposed in said second groove.

9. The photovoltaic apparatus according to claim 2, wherein said second groove is so formed as to pass through said intermediate layer and said first photoelectric conversion portion and expose the surface of said first substrate electrode.

10. The photovoltaic apparatus according to claim 1, wherein said intermediate layer has a function of partly reflecting and partly transmitting light incident from the side of said substrate.

* * * * *